United States Patent [19]
Turner

[11] Patent Number: 5,977,891
[45] Date of Patent: Nov. 2, 1999

[54] BASE FOUR SERIAL COMMUNICATION SYSTEM

[75] Inventor: Robert Stephen Turner, Rochester Hills, Mich.

[73] Assignee: Robert S. Turner, Sterling Heights, Mich.

[21] Appl. No.: 08/937,699

[22] Filed: Sep. 29, 1997

[51] Int. Cl.⁶ ........................................... H03M 5/04
[52] U.S. Cl. ............................................. 341/83; 375/286
[58] Field of Search ............................. 341/83; 375/286, 375/257, 244

[56] References Cited

U.S. PATENT DOCUMENTS

| | | | |
|---|---|---|---|
| 5,359,626 | 10/1994 | Kloker | 375/7 |
| 5,412,688 | 5/1995 | Marbot | 375/220 |
| 5,450,530 | 9/1995 | Snyder | 375/220 |
| 5,555,545 | 9/1996 | Yang | 375/220 |
| 5,579,336 | 11/1996 | Fitzgerald | 375/219 |
| 5,617,455 | 4/1997 | Mok | 375/377 |

*Primary Examiner*—Brian Young

[57] ABSTRACT

This invention consists of a data communications interface that provides the means for an electronic, binary, data processing apparatus, or digital computer, to encode information in a base four format, and to communicate, with other data processing apparatuses, which utilize this invention, by exchanging base four digits, in a serial manner, via a standard data communications medium, such as a telephone line. This invention is composed of a serial communication device (SCD) and a line driver (LD). The SCD converts parallel, binary data to serial, base four data, and visa versa. The LD converts base four voltage levels to signals that are appropriate for the communications medium, and visa versa. A tone, for example, would be an appropriate signal for a telephone line. This invention enables information to be exchanged much more rapidly than is possible with a state of the art system.

18 Claims, 6 Drawing Sheets

A Base Four Network

A State of The Art Network

A Base Four Network

Serial Communication Device

Logic Circuit

Electronic Switch

Base Two to Base Four Converter

Base Four to Base Two Converter

Base Four Storage Element

Line Driver

Power Supply

BASE FOUR SERIAL COMMUNICATION SYSTEM

BACKGROUND

1. Field of Invention

This invention relates to data transmitting and receiving interface devices, and more particularly to those devices that utilize asynchronous serial electronic communication.

2. Description of Prior art

Communication among digital systems, personal computers, has become a necessity in recent years with the advent of local area computer networks and the world wide web. Much of this communication is done via telephone line, cable, optical, or radio media, so the information must be exchanged in a serial manner. That is, only one piece of information is exchanged at a time. Serial communication among digital systems requires the use of special interface equipment. A typical state of the art serial communication network is shown in FIG. 1. The special interface equipment includes Universal Asynchronous Receiver Transmitters (UARTS), and line drivers. A detailed description of the operation of this state of the art network is given below.

The digital systems communicate with their respective UARTs in a parallel manner using the parallel interfaces 30 31. In parallel communication, binary words are exchanged. A binary word consists of several, typically sixteen, binary digits (bits). In the parallel interface, bits are represented by voltage levels. A logic zero is typically represented by zero volts, and a logic one is typically represented by five volts. A separate wire is required for each bit. A typical parallel interface will, therefore, contain sixteen communication wires plus two or three control wires.

The UARTs communicate with their respective line drivers in a serial manner using the serial interfaces 32 33. In serial communication, bits are exchanged sequentially. That is, the sending UART breaks up a binary word into bits and sends one bit at a time. The receiving UART receives one bit at a time and combines the bits into binary words. The number of bits transmitted in a second is known as the baud rate. In a typical serial interface, the bits are represented by either voltage or current levels, and a typical serial interface will contain one or two communication wires and two or three control wires.

The line drivers communicate with each other via the communication medium 34. The sending line driver, first, converts each bit, received from its UART, into an appropriate voltage level, current, tone, light pulse, or radio frequency, and, then, sends the signal out over the communication medium. The receiving line driver, first, converts the received signal to a voltage level, and, then, sends this voltage level to the respective UART.

To summarize, a binary word is transferred from one digital system to another as follows. The sending digital system sends a binary word to the respective UART. The UART breaks up the binary word into bits and sends each bit, sequentially, to the respective line driver. The line driver converts each bit into an appropriate signal, and sends the signal out over the communication medium. The receiving line driver converts the received signal into a bit and sends this bit to the respective UART. The UART combines the bits into a binary word, and sends the word to the respective digital system. The receiving digital system receives the binary word.

This communication process is slow, since only one bit can be transferred at a time. A state of the art system operates at 56K baud, and this means that the transfer of a one megabit file would require at least eighteen seconds.

Several solutions have been proposed to increase the throughput of bits, but thus far, no solution has been proposed that would enable the serial transfer of more than one bit at a time.

OBJECTS AND ADVANTAGES

In this patent application, a new serial communication system is proposed as a solution to the problem of slow serial communication among digital systems. This invention, unlike the prior art, allows for more than one bit to be transferred at a time in a serial manner This invention, therefore, enables faster serial communication than the prior art.

Drawing Figures

Figure 1:
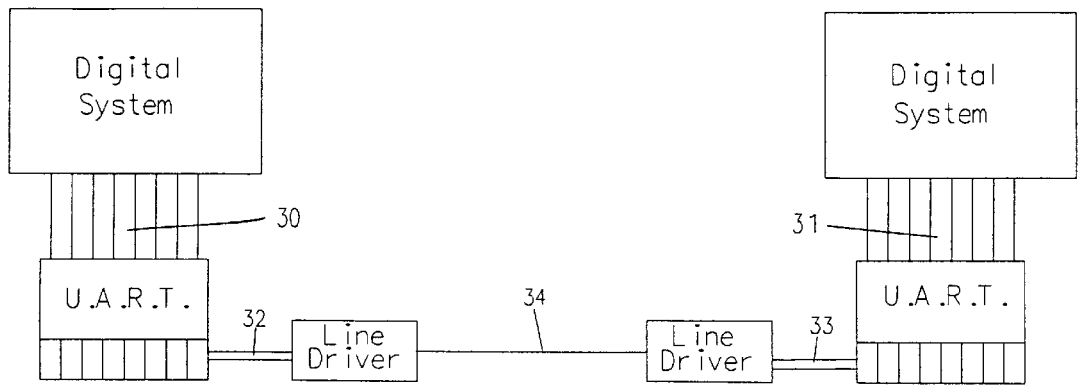
FIG. 1 shows a state of the art serial communication network. The Digital Systems, UARTs, Line Drivers, Parallel Interfaces, Serial Interfaces, and Communication Medium are shown.

REFERENCE NUMERALS IN DRAWINGS 30, 31 Parallel interfaces in a state of the art system
32, 33 Serial interfaces in a state of the art system
34 A communication medium in a state of the art system
35, 36, 37 Operational amplifiers in the 2→4.
38, 39, 40 Comparators in the 4→2.
41 The electronic switches in the line driver that are enabled when the LD is in its Send mode.
42 The electronic switches in the line driver that are enabled when the LD is in its Receive mode.
43 Rectifier diodes in the line driver circuit.
44 The sampling resistor in the line driver circuit.
45 The differential amplifier in the line driver circuit.
46 The electronic switches in the SCD that are enabled when the SCD is in its Parallel Input mode.
47 The electronic switches in the SCD that are enabled when the SCD is in either its Serial Input or Serial Output mode.
48 The electronic switch in the SCD that is enabled only when the SCD is in its Serial Output mode.
49 The electronic switch in the SCD that is enabled only when the SCD is in its Serial Input mode.
50 The B4S that holds the most significant digit in the base four shift register.
51 The B4S that holds the second most significant digit in the base four shift register.

52 The B4S that holds the start digit in base four shift register.
53 The electronic switches in the SCD that are enabled when the SCD is in its Parallel Output mode.

Description—FIGS. 3 to 10

This invention is composed of two main subsystems: a serial communications device (SCD) and a line driver (LD). The structures of these subsystems are explained in the following paragraphs.

Figure 3:
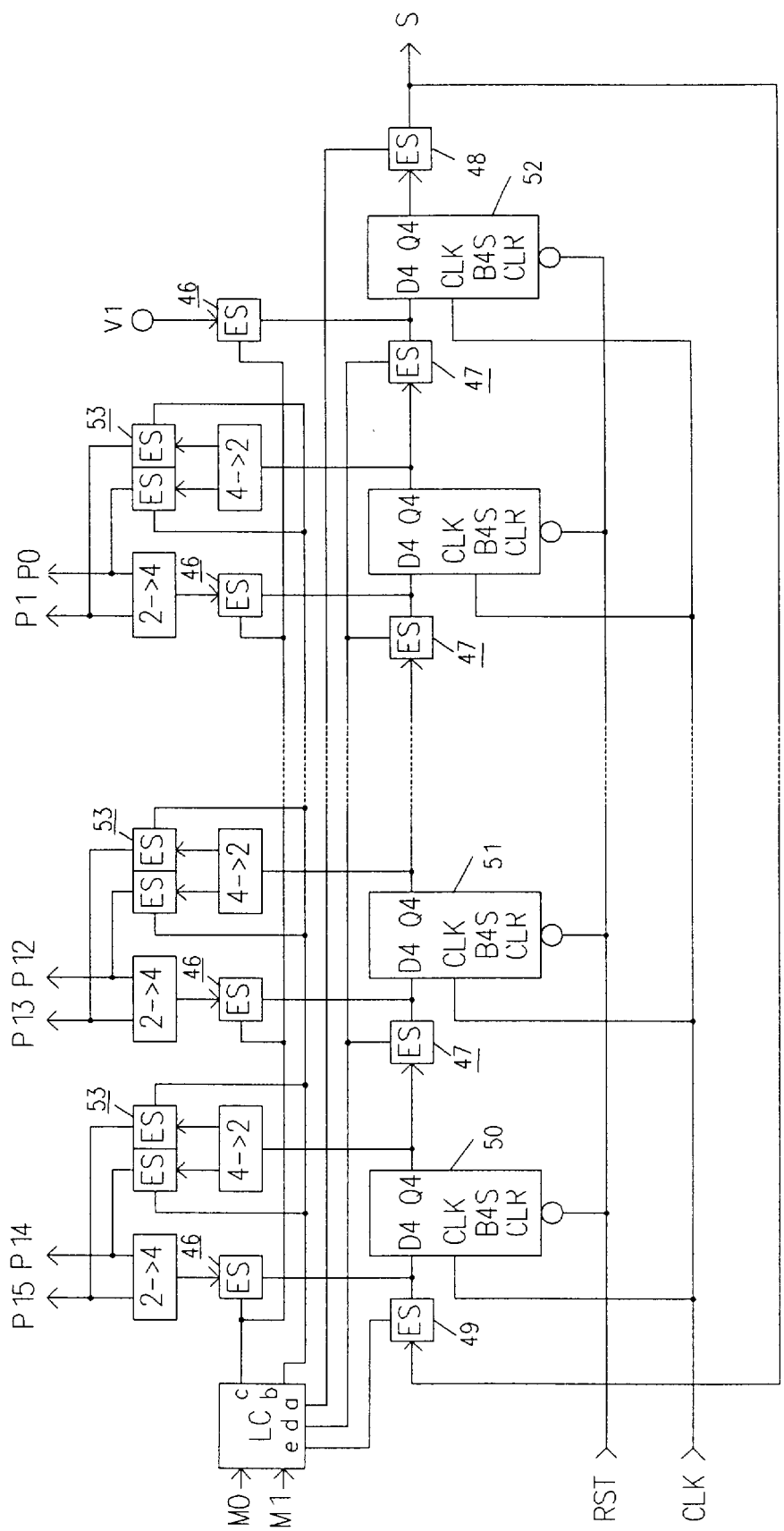
FIG. 3 shows a block diagram of the Serial Communication Device SCD. All sub components and all interface ports are shown.

The serial communication device is composed of a logic circuit (LC), thirty-three electronic switches (ES), eight base two to base four converters (2→4), eight base four to base two converters (4→2), and eight base four storage elements (B4S), as shown in FIG. 3.

Figure 4:
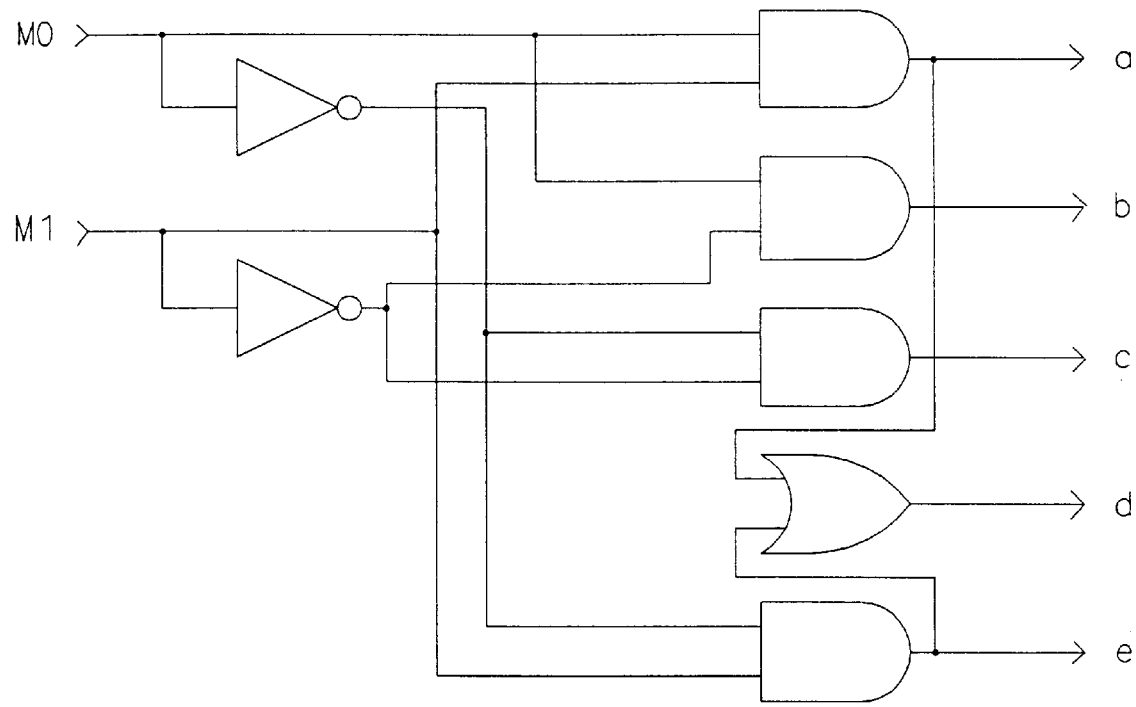
FIG. 4 shows a schematic diagram of the SCD's logic circuit LC.

The logic circuit is composed of four AND gates, one OR gate, and two inverters, as shown in FIG. 4. These gates are standard high speed CMOS logic circuits.

Figure 5:
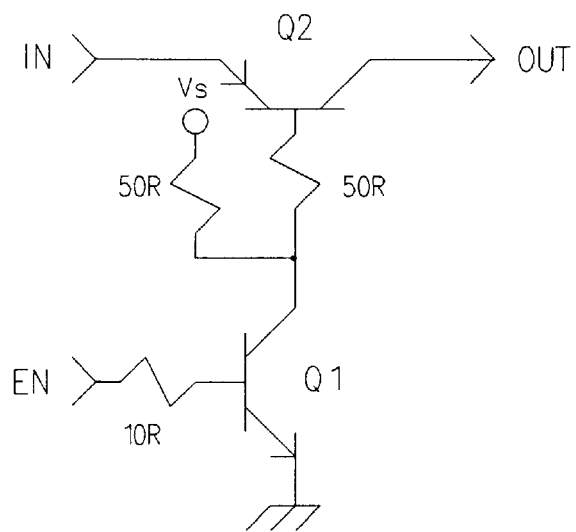
FIG. 5 shows a schematic diagram of the electronic switch ES that is used in this invention.

Each electronic switch is composed of three resistors, one PNP transistor, and one NPN transistor, as shown in FIG. 5. Each resistor is a ¼ W. carbon film, 1% component. R is typically 1K Ohms. Each transistor is a small signal device whose current gain is about 100. Vs is typically 20 V.

Figure 6:
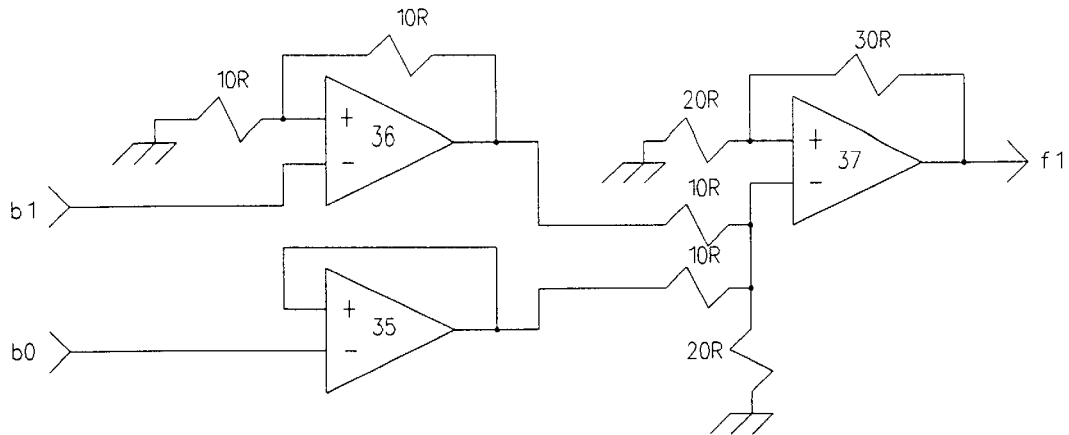
FIG. 6 shows a schematic diagram of a base two to base four 2→4 converter.

Each base two to base four converter is composed of three operational amplifiers and seven resistors, as shown in FIG. 6. Each op amp is a standard, single supply, device whose slew rate is at lease 8 V/uS, and whose gain-bandwidth produce is at least 200 KHz. Each resistor is a ¼ W, carbon film, 1% component. R is typically 1K Ohms.

Figure 7:
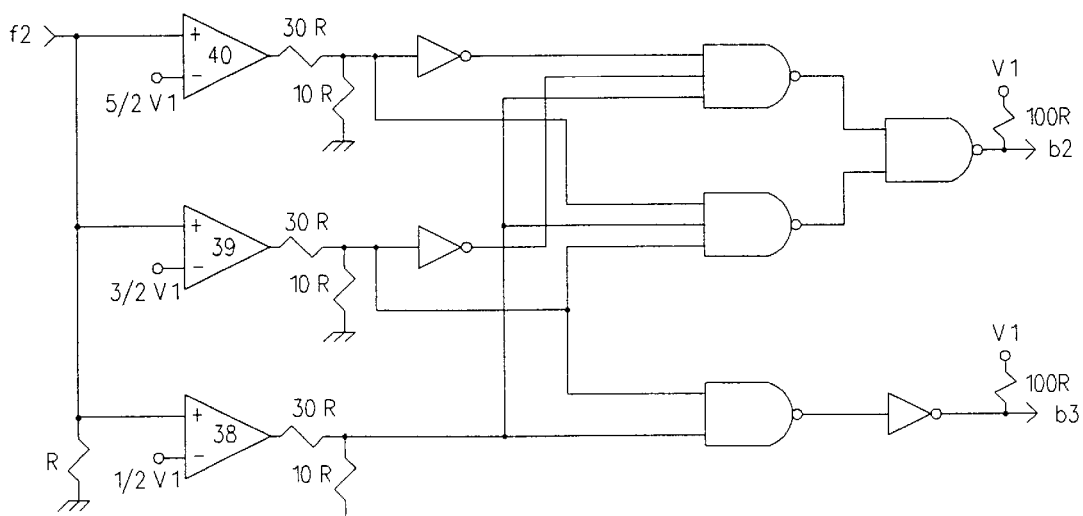
FIG. 7 shows a schematic diagram of a base four to base two 4→2 converter.

Each base four to base two converter is composed of three comparators, four NANO gates, three inverters, and nine resistors, as shown in FIG. 7. Each comparator is a single supply device whose slew rate is at least 10 V/uS. Each logic gate is a standard high speed CMOS circuit. Each resistor is a ¼ W, carbon film, 1% component. R is typically 1K Ohms. V1 is typically 5 V.

Figure 8:
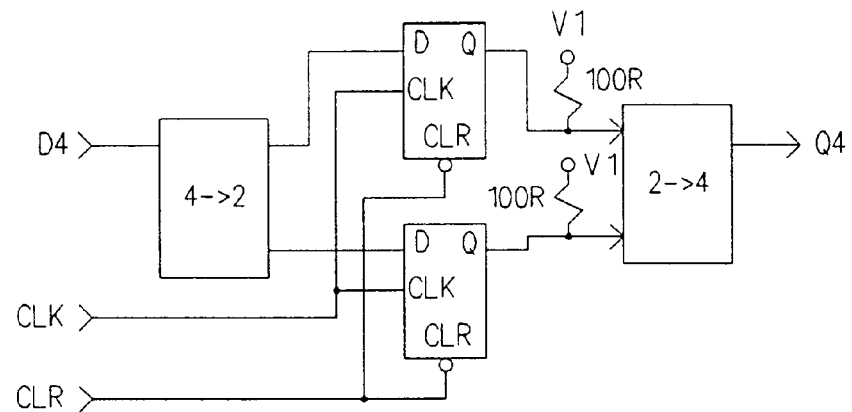
FIG. 8 shows a block diagram of a base four storage element B4S.

Each base four storage element is composed of a base four to base two converter, a base two to base four converter, two flip-flops, and two resistors, as shown in FIG. 8. The converters are composed as described previously, and the flip-flops are standard high speed CMOS devices.

Figure 9:
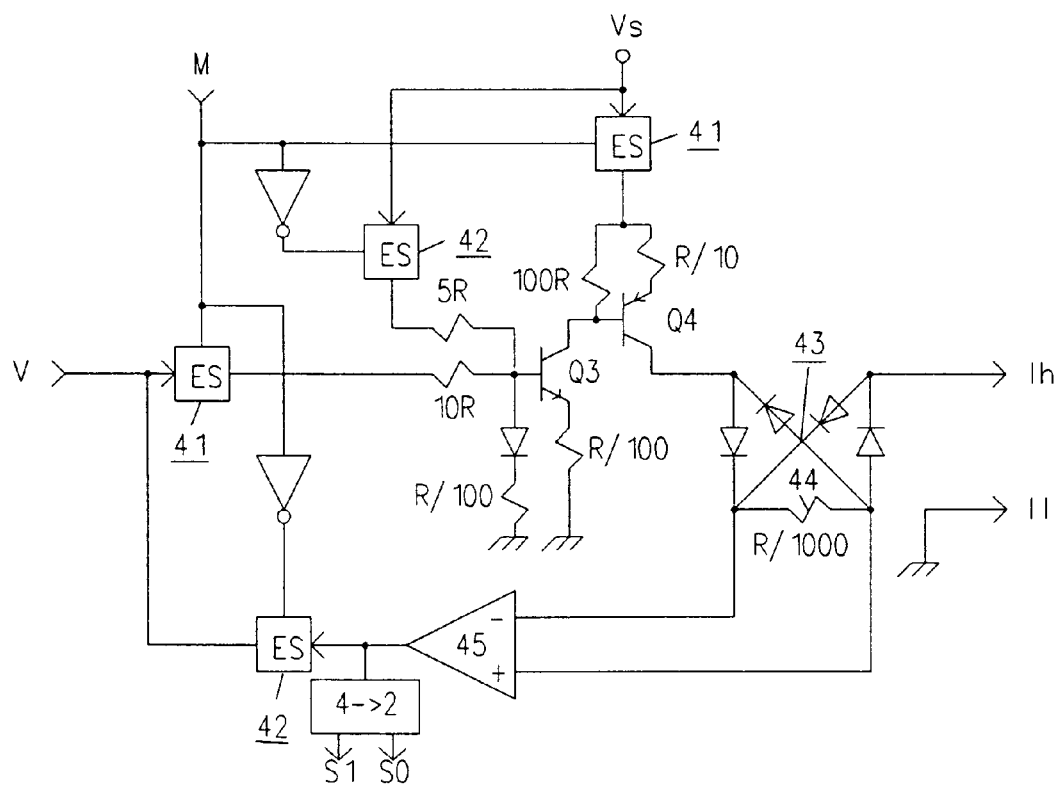
FIG. 9 shows a schematic diagram of a line driver LD.

The line driver is composed of four electronic switches, a base four to base two converter, two inverters, a differential amplifier, a PNP transistor, an NPN transistor, five diodes, and 7 resistors, as shown in FIG. 9. The electronic switches, the base four to base two converters, and the inverters are composed as described previously. The differential amplifier is a single supply circuit whose differential voltage gain is 1000, and whose common mode voltage gain is at or near zero. The transistors are small signal devices whose current gains are about 100. Each diode is a small signal, silicon device whose peak inverse voltage rating is at least fifty volts. Each resistor is a ¼ W, carbon film, 1% component. R is typically 1K Ohms.

Figure 10:
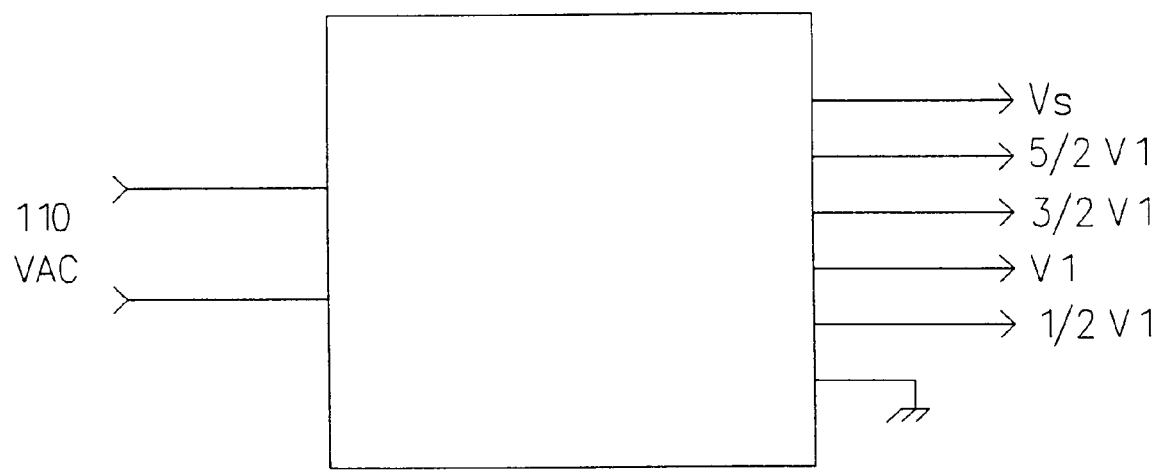
FIG. 10 shows a block diagram of the power supply.

The line driver and the serial communication device both require various power sources. A typical power supply that can serve all of these requirements is shown in FIG. 10. This power supply converts the line voltage, 110 VAC, into five DC voltages, and regulates each of these voltages to within one percent of its nominal value. Vs is typically 20 V, and V1 is typically 5 V. This power supply, also, supplies the current required for each voltage source. The Vs source can typically supply 500 mA. The V1 source can typically supply 250 mA, and the other three sources can typically supply 50 mA each.

Operation—FIGS. 2 to 9

In state of the art serial communication, information is encoded as binary numbers, and digital systems communicate by exchanging bits. With this invention, information in encoded as base four numbers, and digital systems can communicate by exchanging base four digits. This means that half as many digits need to be exchanged, and half of the time is required for the same communication.

This invention consists of a serial communication device (SCD) and a line driver (LD). The operation of these components is described in detail in the following paragraphs. This description is followed by a description of the operation of a typical network which uses these components. This network description is, then, followed by a detailed description of the operation of each sub component of the SCD and the LD.

The SCD takes the place of the UART. That is, the SCD converts parallel communication to serial communication, and visa versa. The SCD, also, converts binary information to base four information, and visa versa as explained below.

Figure 2:
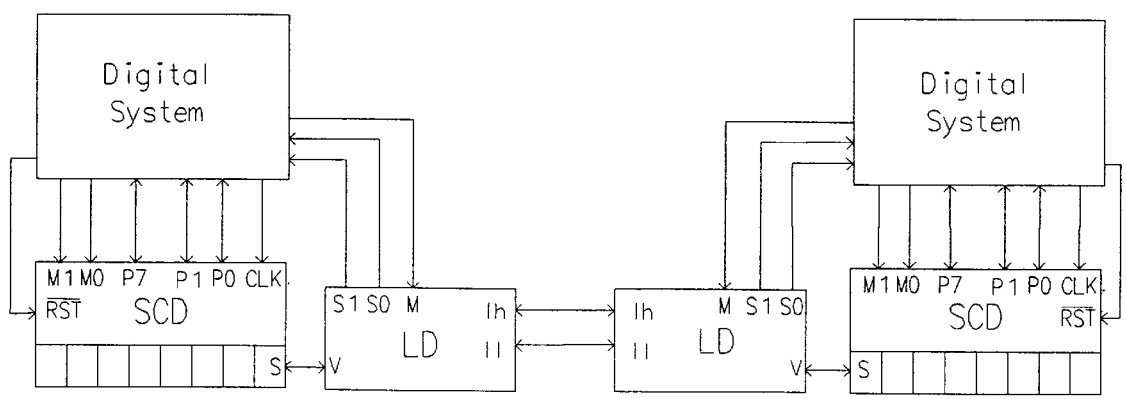
FIG. 2 shows a base four serial communication network. The Digital Systems, Serial Communication Devices, Line Drivers, and all interconnecting lines are shown.

The SCD communicates with a digital system in parallel via the parallel lines, P0–P15, as shown in FIG. 2. Each of these lines carries a binary voltage level. A Low is represented by zero volts, and a High is represented by V1, which is typically five volts.

The SCD internally converts these sixteen binary voltage levels to eight base four voltage levels and visa versa. In base four, a Zero is represented by zero volts. A One is represented by V1, which is typically five volts. A Two is represented by 2V1, and a Three is represented by 3V1.

The SCD communicates with the LD in a serial manner via line S. The SCD either reads base four voltages from, or writes base four voltages to, line S sequentially.

The SCD's operation is controlled by the control lines RST, CLK, M0, and M1. These lines carry binary voltage levels.

The line labeled RST is the reset line. When this line is Low, the contents of the SCD are cleared. When the reset line is High, it has no effect of the SCD.

The line labeled CLK is the clock line. This clock, which is asserted on its Low to High transition, causes information to either be loaded into the SCD in parallel or shifted into or out of the SCD in a serial manner depending on the SCD's mode of operation.

The lines labeled M0 and M1 are the mode selection lines. These lines determine the SCD's mode of operation according to the following truth table:

| M1 | M0 | Mode |
| --- | --- | --- |
| 0 | 0 | Parallel Input |
| 0 | 1 | Parallel Output |
| 1 | 0 | Serial Input |
| 1 | 1 | Serial Output. |

In the Parallel Input mode of operation, information is written to the SCD via P0–P15. In a typical write cycle, the digital system places voltages on P0-P15, and then toggles the clock from Low to High. The binary voltage levels are converted to base four, and latched into base four storage elements within the SCD.

In the Parallel Output mode of operation, information is read from the SCD via P0–P15. In a typical read cycle, the SCD places voltages on P0–P15, and the digital system reads them. No clock pulse is required for a read cycle.

In the Serial Input mode of operation, base four voltages, which are placed on Line S by the LD, are shifted into the SCD sequentially. That is, one voltage is shifted per clock pulse. It would take nine clock pulses to fill the SCD. One pulse would be required for the start digit, and eight pulses would be required for the data digits.

In the Serial Output mode of operation, the base four voltages, which are stored in the SCD, are shifted out to line S sequentially. It would, therefore, take nine clock pulses to empty the SCD.

The function of the Line Driver is to provide an interface between the SCD and the communications line. The communications line is typically a two wire shielded twisted pair cable. In a typical network, a communications line will have an LD attached to each end, as shown in FIG. 2. An LD converts base four voltage levels proportional current levels, and visa versa. A Zero is typically represented by no current. A One is typically represented by 50 mA. A Two is typically represented by 100 mA, and a Three is typically represented by 150 mA.

The Line Driver's mode of operation is determined by the state of its M line which carries a binary voltage level. For M=0, the LD is in its Receive mode of operation. In this mode, a current is forced into the Ih line, and out of the Il line by the sending LD. The receiving LD converts this current to a base four voltage level, and places this voltage on the V line to be loaded into the SCD. For M=1, the LD is in its Send mode of operation. In this mode, a base four voltage level is placed on the V line by the SCD, and the LD forces a proportional current out of its Ih line. The return current enters the LD via its Il line.

The LD provides status feedback to its digital system via lines S0 and S1. These lines, which carry binary voltage levels, indicate the contents of the communications line according to the following truth table:

| S1 | S0 | Line Contents |
|----|----|---------------|
| 0  | 0  | 0 |
| 0  | 1  | 1 |
| 1  | 0  | 2 |
| 1  | 1  | 3. |

FIG. 2 shows a typical network which utilizes the proposed invention. An analysis of a typical communication is now given.

The sending digital system (DS) will first set its SCD to its Parallel Input mode, and will write a word, sixteen bits, to the SCD. The sending DS will, then, set its LD to its Send mode, and its SCD to the Serial Output mode, and the DS will proceed to, sequentially, clock out the nine digits. The SCD will, sequentially, send base four voltages to the respective LD, and the LD will put a proportional current on the communications line for each received voltage.

The receiving DS will, first, see a change on its status lines, S0 S1, and will detect a transmission. The receiving DS will, next, set its SCD to its Serial Input mode and will, sequentially, clock the nine digits into the SCD. The receiving DS will, then, set its SCD to its Parallel Output mode, and will read the word.

After the communication is complete, both digital systems will set their Line Drivers to their Receive modes and will scan the respective status inputs for a transmission.

The SCD and LD are each composed of many sub components. The operation of each of these sub components will be described in detail in the following paragraphs.

The serial communication device is composed of a logic circuit (LC), thirty-three electronic switches (ES), eight base two to base four converters (2→4), eight base four to base two converters (4→2), and eight base four storage elements (B4S), as shown in FIG. 3. The operation of each of these sub components will be described, and this will be followed by a description of the operation of the SCD as a system.

The function of the LC, shown in FIG. 4, is to select the SCD's mode of operation. The LC performs its function by putting out a unique combination of binary voltage levels for a given combination of input values. The truth table for this circuit is given below.

| Mode | M1 | M0 | a | b | c | d | e |
|------|----|----|---|---|---|---|---|
| Parallel Input  | 0 | 0 | 0 | 0 | 1 | 0 | 0 |
| Parallel Output | 0 | 1 | 0 | 1 | 0 | 0 | 0 |
| Serial Input    | 1 | 0 | 0 | 0 | 0 | 1 | 1 |
| Serial Output   | 1 | 1 | 1 | 0 | 0 | 1 | 0 |

The function of the ES, shown in FIG. 5, is to make or break a current path. Current can flow from IN to OUT when EN is High, but current can not flow when EN is Low. When EN is High, base current flows in Q1, and this enables sufficient base current to flow in Q2 to saturate Q2. Current can, therefore, flow through Q2 from IN to OUT. When EN is Low, however, no base current flows in either transistor, so no current can flow from IN to OUT.

The function of the 2→4, shown in FIG. 6, is to encode two binary voltage levels as a single base four voltage level. This circuit performs its function by doubling the input voltage b1, the most significant bit, and adding the result to the input voltage b0, the least significant bit, to produce the output voltage f1, a base four voltage level. Op amp 35 buffers, or multiplies by one, the b0 input. Op amp 36 doubles input b1, and op amp 37 adds the two results together. The binary and base four voltage levels are as previously described.

The function of the 4→2, shown in FIG. 7, is to convert a base four voltage level to two binary voltage levels. This circuit performs its function as follows. The base four input voltage level f2 is compared to three different voltage thresholds by the comparators 38 39 40. If f2 is zero volts, then the outputs of all three comparators will be zero volts. If f2 is greater then or equal to VI then the output of comparator 38 will be Vs. If f2 is greater than or equal to V2 then the outputs of comparators 38 and 39 will be Vs, and if f2 is greater than or equal to V3 then the outputs of all three comparators will be Vs. Each comparator has resistors attached to its output to divide the output down to a binary voltage level. These binary voltage levels are fed to logic gates, and the logic gates, in turn, produce the binary output voltages b2 and b3. The b2 output is the least significant bit, and the b3 output is the most significant bit. This circuit implements the following truth table:

| f4 | b3 | b2 |
|----|----|----|
| 0  | 0  | 0 |
| 1  | 0  | 1 |
| 2  | 1  | 0 |
| 3  | 1  | 1. |

The function of the B4S, shown in FIG. 8, is to store a base four voltage level. This circuit functions as follows. First, a base four voltage level is placed on D4. This voltage level is converted to two binary voltage levels by the 4→2, and these voltages are applied to the D inputs of the flip-flops. The CLK line is, then, toggled from low to high, and the D input voltage levels are stored in the respective flip-flops. Also, these voltages are transferred to the respective Q outputs. The Q output voltage levels are converted to a base four voltage level by the 4→2, and this output is present on Q4. The result is that the D4 input voltage level is transferred to Q4, and is stored. The CLR line, when Low, clears the contents of both flip-flops. When CLR line is high, it has no effect.

The functions of the LD, shown in FIG. 9, are to convert base four voltage levels to proportional current levels, and visa versa, and to provide communication line status feedback. The operation of this circuit is described in detail below.

When the LD is in its Send mode, line M is High, and electronic switches 41 are enabled. When a voltage is placed on line V, base current flows in transistor Q3, and this allows base current to flow in transistor Q4. A proportional amount of collector current will flow in Q4. This collector current will flow through the rectifier diodes 43, through the sampling resistor 44, through Ih, through the mating LD, and back through Il. This current is proportional to the input V.

When the LD is in the receive node, M is Low, and electronic switches 42 are enabled. Transistor Q3 is held in saturation, and the emitter of Q4 is disconnected from the circuit. An incoming current can flow in through Ih, through the rectifier diodes 43, through the sampling resistor 44, through the collector-base junction of Q4, through Q3, and back out through Il. The rectifier diodes 43 allow current to flow through the sampling resistor 44 in only one direction. The voltage that is dropped across this sampling resistor is amplified by the differential amplifier 45 and is output to line V This voltage is proportional to the input current.

The status feedback is provided as follows. The output of differential amplifier 45, which is present in either Send or Receive mode, is input to the 4→2. The output of the 4→2 forms the status feedback.

The SCD, shown in FIG. 3, is composed of many components as previously discussed. A detailed explanation of the operation of the SCD as a system is now given.

When the SCD is in its Parallel Input mode of operation, electronic switches 46 are enabled. This allows the binary voltages, that are present on P0–P15, to be converted to base four, by the 2→4s, and to be placed on the D4 inputs to the B4Ss. When the CLK line is toggled from low to high, the D4 input voltages are loaded into the B4Ss.

When the SCD is in its Serial Output mode of operation, electronic switches 47 and 48 are enabled. This connects the output of B4S 52 to line S. When the CLK is toggled from Low to High, the contents of each B4S is shifted to the B4S to the right. That is, the contents of B4S 50 is shifted to B4S 51, etc., and the original contents of B4S 52 is lost.

When the SCD is in its Serial Input mode of operation, electronic switches 47 and 49 are enabled. On the first clock pulse, the voltage, present on S, is loaded into B4S 50. On the second clock pulse, the contents of B4S 50 is shifted to B4S 51, and the voltage, present on S, is loaded into BS 50. This process continues until the SCD if fully loaded.

When the SCD is in its Parallel Output mode of operation, electronic switches 53 are enabled. This allows the Q4 outputs to be converted to binary, and placed on P0–P15.

This concludes the explanations of the operations of the SCD, LD, and all sub components.

Summary, Ramifications, and Scope

In this invention, a communication system is proposed that enables digital systems to exchange more than one bit at a time via standard serial communications media. In this proposed serial communication system, information is encoded as base numbers, instead of binary numbers, and base four digits are exchanged instead of bits. Twice as much information can, therefore, be exchanged in the same amount of time as that of a state of the art system.

The above description contains many specifications, but these should not be construed as limitations on the scope of this invention. These specifications are exemplifications of one preferred embodiment. Other embodiments are possible. For example, the Line Driver could be designed to interface the SCD to an optical medium. Accordingly, the scope of this invention should be determined, not by the embodiment illustrated, but by the appended claims and their legal equivalents.

What is claimed is:

1. A data communications interface that provides the means for an electronic, binary, data processing apparatus (DPA) to encode information in a base four format, and to communicate, by asynchronously exchanging base four information via a standard data communications medium, with other data processing apparatuses, each of which utilizes this interface; said data communications interface is comprised of:

a serial communication device (SCD) which provides the means for converting binary voltage levels to base four voltage levels and visa versa, and for converting parallel data to serial data and visa versa;

a line driver (LD) which provides the means for converting a base four voltage level to an appropriate signal for transmission via the communications medium, and for converting a signal, received from the communications medium, to a base four voltage level.

2. The data communications system of claim 1, wherein the SCD is comprised of: a plurality of base two to base four converters, a plurality of base four to base two converters, a plurality of base four storage elements, and a plurality of electronic switches.

3. The SCD of claim 2, wherein each base two to base four converter is an electronic circuit which has two binary voltage level inputs and one base four voltage level output.

4. The SCD of claim 2, wherein each base four to base two converter is an electronic circuit which has one base four voltage level input and two binary voltage level outputs.

5. The SCD of claim 2, wherein each base four storage element is an electronic circuit which has a base four voltage level input, a base four voltage level output, a clock input, and a reset input.

6. The SCD of claim 2, wherein each electronic switch is an electronic circuit which has a signal input, a signal output, and an enable line.

7. The data communications interface of claim 1, wherein the SCD is electrically connected to the LD, the LD is adapted to be connected to the communications medium, and the SCD and the LD are both electrically connected to a respective DPA.

8. The data communications interface of claim 1, wherein the SCD is controlled by binary voltage levels from the respective DPA.

9. The data communications interface of claim 1, wherein the SCD exchanges binary voltage levels with the respective DPA in a parallel manner.

10. The data communications interface of claim 1, wherein the SCD exchanges base four voltage levels with the LD in an asynchronous, serial manner.

11. The data communications system of claim 1, wherein the LD is comprised of: a base four voltage level to drive signal converter, a drive signal to base four voltage level converter, a base four to base two converter, and a plurality of electronic switches.

12. The LD of claim 11, wherein the base four voltage level to drive signal converter, and the drive signal to base four voltage level converter are both comprised of electronic circuits.

13. The data communications interface of claim 1, wherein the LD is controlled by binary voltage levels from the respective DPA.

14. The data communications interface of claim 1, wherein the LD provides communications medium status feedback to the the respective DPA in the form of binary voltage levels.

15. A base four storage element which provides the means for storing a base four voltage level; said base four storage element is comprised of:
- a base four to base two converter which is an electronic circuit that converts a base four voltage level to two binary voltage levels;
- two D flip-flops which provide the means for storing binary voltage levels;
- a base two to base four converter which is an electronic circuit that converts two binary voltage levels to a base four voltage level;
- a base four voltage level input;
- a base four voltage level output;
- a clock input, and a reset input.

16. The base four storage element of claim 15, wherein the clock and reset inputs are binary voltage levels.

17. The base four storage element of claim 15, wherein the base four voltage level, that is input to the storage element, is loaded into the storage element when the clear input is high, and the clock is toggled from low to high.

18. The base four storage element of claim 15, wherein the contents of the storage element is cleared when the clear input is low.

* * * * *